United States Patent
Li et al.

(10) Patent No.: US 11,291,145 B2
(45) Date of Patent: Mar. 29, 2022

(54) INTEGRATED ANTENNA DEVICE

(71) Applicant: HEWLETT PACKARD ENTERPRISE DEVELOPMENT LP, Houston, TX (US)

(72) Inventors: Kuanyue Li, Beijing (CN); Hongli Zhang, Beijing (CN); Yuhai Guo, Beijing (CN)

(73) Assignee: Hewlett Packard Enterprise Development LP, Houston, TX (US)

( * ) Notice: Subject to any disclaimer, the term of this patent is extended or adjusted under 35 U.S.C. 154(b) by 55 days.

(21) Appl. No.: 16/424,906

(22) Filed: May 29, 2019

(65) Prior Publication Data

US 2020/0383249 A1 Dec. 3, 2020

(51) Int. Cl.
*H01Q 1/22* (2006.01)
*H01Q 1/24* (2006.01)
*H05K 9/00* (2006.01)
*H05K 1/02* (2006.01)
*H01Q 17/00* (2006.01)

(52) U.S. Cl.
CPC ......... *H05K 9/0026* (2013.01); *H01Q 1/2283* (2013.01); *H01Q 17/00* (2013.01); *H05K 1/0243* (2013.01); *H05K 9/0037* (2013.01)

(58) Field of Classification Search
CPC .. H05K 9/0022; H05K 9/0026; H05K 9/0037; H05K 1/0243; H05K 9/002; H05K 1/181; H01Q 1/2283; H01Q 1/241; H01Q 1/243; H01Q 1/526; H01Q 9/0421; H01Q 9/045; H01Q 5/37; H01Q 1/22; H01Q 1/24; H01Q 1/38; H01Q 1/52; H01Q 1/2291; H01Q 9/04; H01Q 5/35; H01Q 5/371
See application file for complete search history.

(56) References Cited

U.S. PATENT DOCUMENTS 6,204,825 B1 3/2001 Wilz
6,392,603 B1 5/2002 Kurz et al.
6,850,196 B2 * 2/2005 Wong ..................... H01Q 1/243
343/702

(Continued)

FOREIGN PATENT DOCUMENTS

EP  1398847 A1  3/2004

OTHER PUBLICATIONS

EMC Internal Patch Antenna Integrated with a U-Shaped Shielding Metal Case for Mobile Device Application Jun. 2006, pp. 1-5, Retrieved from the Internet on Feb. 4, 2019 from URL: <researchgate.net/publication/227804371_EMC_internal_patch_antenna_integrated_with_a_U-SHAPED_shielding_metal_case_for_mobile_device_application>.

*Primary Examiner* — Thai Pham
(74) *Attorney, Agent, or Firm* — Nolte Lackenbach Siegel

(57) ABSTRACT

An antenna device may include an antenna element, a planar grounding element, a first connecting element, and a second connecting element. The antenna element includes a radiator arm, a shorting arm, and a feeder arm, the shorting arm and the feeder arm being coplanar to and extending from a first edge of the radiator arm, the feeder arm extending parallel to the shorting arm. The first connecting element connects the shorting arm of the antenna element to the planar grounding element to position the antenna element and the planar grounding element in separate parallel planes. The second connecting element extends from and perpendicular to the feeder arm of the antenna element.

18 Claims, 7 Drawing Sheets

(56) References Cited

U.S. PATENT DOCUMENTS

| | | | |
|---|---|---|---|
| 6,861,986 B2 * | 3/2005 | Fang | G06F 1/1616 |
| | | | 343/700 MS |
| 6,937,205 B2 * | 8/2005 | Chou | H01Q 9/0421 |
| | | | 343/841 |
| 6,963,310 B2 * | 11/2005 | Horita | H01Q 9/0442 |
| | | | 343/702 |
| 6,985,108 B2 * | 1/2006 | Mikkola | H01Q 1/243 |
| | | | 343/700 MS |
| 2008/0055160 A1 * | 3/2008 | Kim | H01Q 9/0421 |
| | | | 343/700 MS |
| 2008/0284661 A1 * | 11/2008 | He | H01Q 9/0421 |
| | | | 343/700 MS |
| 2012/0139729 A1 * | 6/2012 | Savarese | G08B 21/023 |
| | | | 340/568.6 |
| 2016/0111789 A1 * | 4/2016 | Chang | H01Q 1/243 |
| | | | 343/702 |

* cited by examiner

INTEGRATED ANTENNA DEVICE

BACKGROUND

A radio frequency ("RF") antenna, or simply "antenna", and an electromagnetic interference ("EMI") shield are included in wireless communication devices, such as mobile devices and access points. The antenna may be used to transmit RF signals from and receive RF signals into a wireless communication device. The EMI shield may be used to protect a RF circuit of the wireless communication device from a surrounding electromagnetic environment, which may degrade performance of the RF circuit. The antenna and the EMI shield may be mounted onto a printed circuit board housed within the wireless communication device.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion. Features of the present disclosure are illustrated by way of example and not limited in the following figures, in which like numerals indicate like elements, in which.

DETAILED DESCRIPTION

Figure 1:
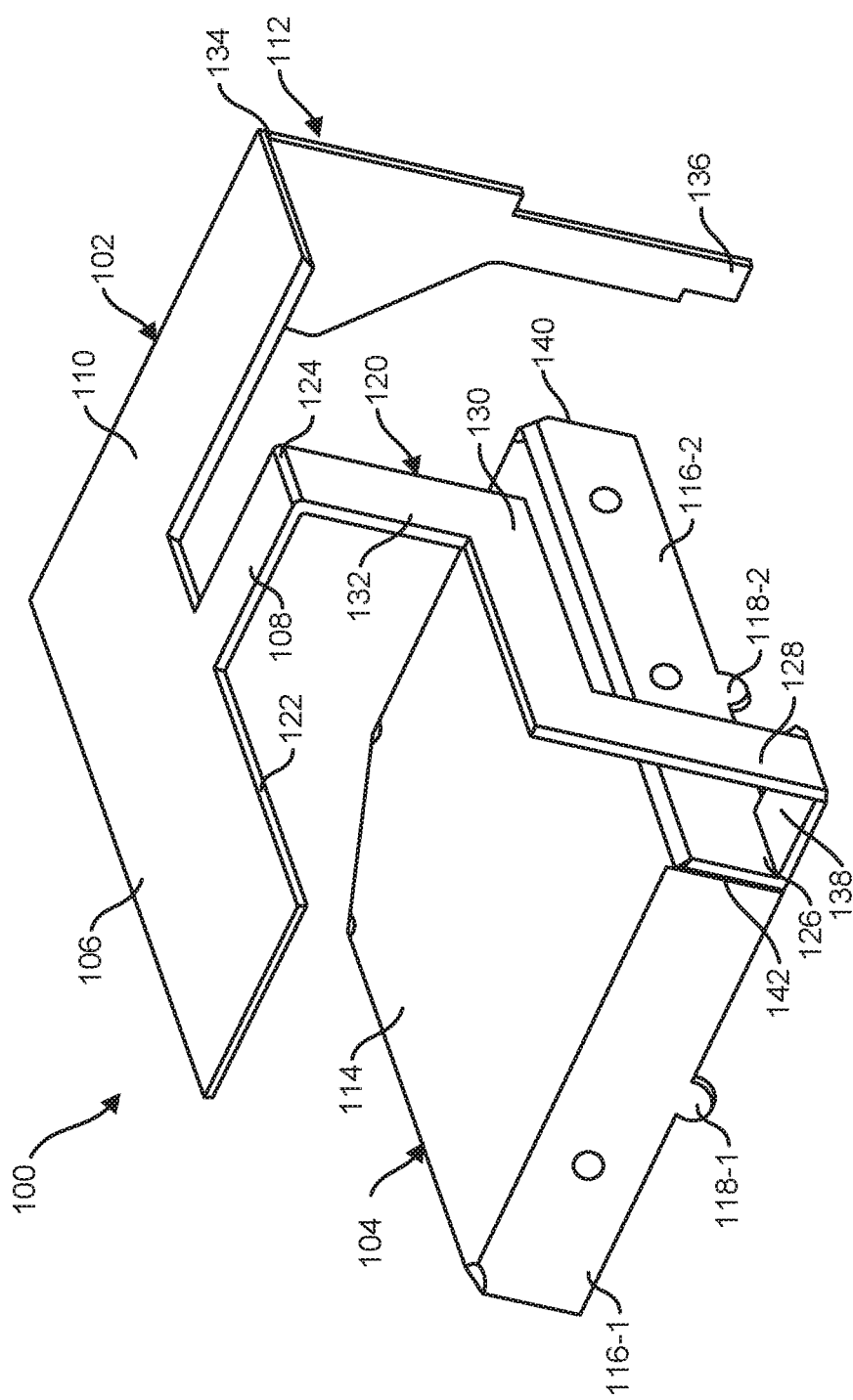
FIG. 1 depicts an integrated antenna device, according to one or more examples of the present disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming; would be a routine undertaking for those of ordinary skill in the art having the benefit of this disclosure.

In some wireless communication devices, the antenna and EMI shield are mounted as two separate components onto a printed circuit board ("PCB"). As separate components, the antenna and EMI shield occupy separate valuable real estate on the PCB. Additionally, in some designs the antenna may necessitate clearance from the highest component on the PCB to minimize interference with RF signals to and from the antenna. Thus, the antenna may be mounted on a top cover of the PCB and electrically connected to a RF circuit using a RF cable. Cable routing may be challenging when considering any interference signals from the PCB and antenna pattern degradation.

Disclosed herein are integrated antenna devices, according to one or more examples of the present disclosure. In one example, an antenna device includes an antenna element, a planar grounding element, a first connecting element, and a second connecting element. The antenna element includes a radiator arm, a shorting arm, and a feeder arm, with the shorting arm and the feeder arm being coplanar to and extending from a first edge of the radiator arm, and with the feeder arm extending parallel to the shorting arm. The first connecting element connects the shorting arm of the antenna element to the planar grounding element to position the antenna element and the planar grounding element in separate parallel planes. The second connecting element extends from and perpendicular to the feeder arm of the antenna element. In a particular example, the planar grounding element forms an EMI shield. Moreover, the second connecting element may include a tapered end to directly electrically connect to a RF circuit on the PCB without using a separate RF cable or connector.

In according with the present disclosure, integrating the antenna element and the planar grounding element, which may also function as an EMI shield, into a single integrated antenna device, and mounting the integrated antenna device onto a PCB conserves space on the PCB. Additionally, a coupling effect between the antenna element and the planar grounding element of the integrated antenna device may enable similar radiation patterns without the shortcomings of using a separate antenna element and EMI shield. Also, the distance between the antenna element and the planar grounding element may be designed to allow sufficient clearance between the antenna element and the tallest components on a PCB so as not to interfere with the radiation patterns of the integrated antenna device. Moreover, impedance matching to an output impedance of an RF circuit may be simplified by designing or shaping the tapered end of the second connecting element to create a matching input impedance, for instance of 50 ohms.

In another example, an integrated inverted-F antenna device includes an antenna element, a grounding element having a planar side, a first connecting element, and a second connecting element. The antenna element includes a radiator arm, a shorting arm, and a feeder arm which form an F-shape in a first plane. The first connecting element connects the shorting arm of the antenna element to the grounding element to position the planar side of the grounding element in a second plane that is separate from and parallel to the first plane. The second connecting element extends from the feeder arm of the antenna element and has a length that extends along a third plane that is perpendicular to the first and second planes.

In another example, an electronic device includes a printed circuit board and an antenna device mounted to the printed circuit board. The antenna device includes an antenna element, an electromagnetic interference shield element, a first connecting element, and a second connecting element. The antenna element includes a radiator arm, a shorting arm, and a feeder arm, with the shorting arm and the feeder arm being coplanar to and extending from a first edge of the radiator arm, and with the feeder arm extending parallel to the shorting arm. The electromagnetic interference shield element includes a planar side and a plurality of extension sides perpendicularly connected to the planar side, with the plurality of extension sides mounted to the printed circuit board. The first connecting element includes a first end connected to the shorting arm of the antenna element and a second end connected to one of the extension sides of the electromagnetic interference shield element. The first connecting element positions the antenna element and the planar side of the electromagnetic interference shield element in separate parallel planes. The second connecting element has a first end connected to the feeder arm of the antenna element and a second end mounted to the printed circuit board.

Turning now to the drawings, FIG. 1 depicts an integrated antenna device 100, also referred to herein as an "antenna device"), according to one or more examples of the present disclosure. Integrated antenna device 100 includes an antenna element 102, a planar grounding element 104, a first connecting element 120, and a second connecting element 112. The antenna element 102, planar grounding element 104, first connecting element 120, and second connecting element 112 form a single integrated structure and may, thereby, be termed herein an 'integrated' antenna device. In one example, the antenna element 102, planar grounding element 104, first connecting element 120, and second connecting element 112 form a single integrated structure by being formed from a single or one-piece, contiguous piece of material. In another example, the antenna element 102, planar grounding element 104, first connecting element 120, and second connecting element 112 form a single integrated structure by being formed from multiple pieces of material that are joined together, such as by welding, soldering, adhering, bonding, etc.

The antenna element 102, planar grounding element 104, first connecting element 120, and second connecting element 112 may be constructed from any suitable electrically conductive material, such as stainless steel. In an example, the material used to construct the integrated antenna device 100 is pre-plated using one or more suitable materials including, but not limited to, nickel, tin, etc., or a combination thereof. Moreover, the manufacturing process may minimize burrs, stains, and oils on the constructed integrated antenna device 100.

The antenna element 102 includes a radiator arm 106, a shorting arm 108, and a feeder arm 110. As illustrated, the shorting arm 108 and the feeder arm 110 are coplanar to and extend from an edge 122 of the radiator arm 106, and the feeder arm 110 extends parallel to the shorting arm 108. As such, the radiator arm 106, shorting arm 108, and feeder arm 110 form an F-shape in a first plane. The antenna element may operate as an antenna to transmit and receive RF signals as later described. In an example, the antenna element 102 forms a planar inverted-F antenna, also referred to herein as "an inverted-F antenna."

The planar grounding element 104, also referred to herein as a "grounding element" includes a planar side 114 and a plurality of planar extension sides collectively referred to by reference number 116. The planar extension sides 116 are also referred to herein as "extension sides." The extension sides 116 are perpendicularly connected to the planar side 114. Although only two extension sides 116-1 and 116-2 are shown, in an example there are a total of five extension sides 116, with one extension side perpendicularly connected to each of five edges of the planar side 114.

Moreover, in an example, the extension sides 116 include one or more protrusions or tabs collectively referred to by reference number 118. In a particular example, each of the extension sides 116 includes a single protrusion 118, with a protrusion 118-1 shown on and coplanar with the extension side 116-1 and a protrusion 118-2 shown on and coplanar with the extension side 116-2. The protrusions 118 facilitate mounting the integrated antenna device 100 to a PCB (not shown). More or fewer protrusions 118 can be included on each of the extension sides 116 to secure the integrated antenna device 100 to the PCB. Additionally, one or more of the extension sides 116 may be electrically connected to a grounding plane of the PCB to electrically ground the planar grounding element 104. For example, one of more of the protrusions 118 may be soldered to a pad connected to one or more traces and/or one or more through plated holes or vias to electrically connect to the grounding plane of the PCB.

When mounted to the PCB, the planar grounding element 104 may form an EMI shield. More particularly, the integrated antenna device 100 may be mounted to the PCB such that the planar grounding element 104 completely or substantially covers a RF circuit (not shown) on the PCB and to which the antenna element 102 is electrically connected. As such, the planar grounding element 104 may assist in providing or creating a shielding cover or faraday cage around components of the RF circuit to block or minimize EMI emissions from reaching the RF circuit. A grounding plane of the PCB may be used as an additional side to completely enclose the RF circuit. Moreover, constructing the integrated antenna device 100 with a single contiguous piece of material may prevent or minimize leaks entering or exiting the EMI shield formed by the planar grounding element 104.

The first connecting element 120 has a first end 124 connected to the shorting arm 108 of the antenna element 102 and a second end 126, also referred to herein as a "grounding end," connected to the extension side 116-2 of the planar grounding element 104. As such, the first connecting element 120 positions the antenna element 102 and the planar grounding element 104 in separate parallel planes. Furthermore, in the example shown, the first connecting element 120 forms two right angles in a plane which is perpendicular to the separate parallel planes within which the antenna element 102 and the planar grounding element 104 are positioned.

More particularly, the first connecting element 120 includes a plurality of sections 138, 128, 130, 132. As illustrated, sections 128, 130, 132 form two right angles in a plane which is perpendicular to the separate parallel planes within which the antenna element 102 and the planar side 114 of the planar grounding element 104 are positioned. As illustrated, the section 132 of the first connecting element 120 is connected to the shorting arm 108 of the antenna element 102. The section 128 of the first connecting element 120 is coupled to the extension side 116-2 of the planar grounding element 104 by the section 138 of the first connecting element 120. The section 130 connects sections 128 and 132 of the first connecting element 120. Particularly, the section 130 has a first end that connects the section 130 to the section 132 at a right angle and a second end that connects the section 130 to the section 128 at a right angle, with sections 128, 130, and 132 positioned in the same plane.

Moreover, sections 128 and 138 are perpendicularly connected, or connected at right angles in perpendicular planes, with the section 138 being coplanar with an edge of the extension side 116-2. Additionally, where the planar grounding element 104 is electrically connected to the grounding plane of a PCB, having the end 124 of the first connecting element 120 connected to the shorting arm 108 and the grounding end 126 of the first connecting element 120 connected to the extension side 116-2 of the grounding element 104 electrically connects the shorting arm 108 to the grounding plane of the PCB. Such connections, thereby, ground the antenna element 102.

The second connecting element 112 extends from and perpendicular to the feeder arm 110 of the antenna element 102 and includes a tapered end 136. Particularly, a length of the second connecting element 112 extends from an end 134 integrated with the feeder arm 110 to the tapered end 136 along a plane that is perpendicular to the separate parallel planes within which the antenna element 102 and the planar side 114 of the planar grounding element 104 are positioned. Accordingly, tapered end 136 is tapered relative to end 134 of the second connecting element 112. The tapered end 136 may mount to a PCB.

In an example, the tapered end 136 of the second connecting element 112 is aligned with a corner 140 of the planar grounding element 104, and the grounding end 126 of the first connecting element 120 is aligned with a corner 142 of the planar grounding element 104. The corner 140 includes a first end of the extension side 116-2. The corner 142 includes a second end of the extension side 116-2. One or a combination of distance between the tapered end 136 and the grounding end 126, length of the first connecting element 120, coupling effect between the antenna element 102 and the planar grounding element 104, an area of the antenna element 102 relative to an area of the planar grounding element 104, distance between the antenna element 102 and the planar grounding element 104, and/or shape of the tapered end 136, may be calculated and fine-tuned (for instance using a circuit simulation tool) to produce a desired radiation pattern of the antenna element 102 in a desired frequency range, while minimizing interference with the radiation pattern and minimizing the footprint of the integrated antenna device 100 on the PCB.

The tapered end 136 may also be electrically connected to a RF circuit on the PCB. For example, the tapered end 136 may be directly electrically connected to a RF circuit covered by the planar grounding element 104. For instance, the tapered end 136 may be directly electrically connected to a transceiver of the RF circuit such that the second connection element 112 serves at least as a portion of a feed line to the feeder arm 110 of the antenna element 102. Directly electrically connected means connected without using a RF cable or a connector that is separate from the PCB. However, the direct electrical connection may be made using any one or more traces, pads, and/or vias constructed or integrated into the PCB. For instance the tapered end 136 may be mounted and soldered to a pad on the PCB, wherein the pad is electrically connected to the RF circuit using any one or more traces, pads, and/or vias constructed into the PCB.

In a particular example, the tapered end 136 is tapered relative to the end 134 of the second connecting element 112 to create a matching input impedance to a RF output end of a RF circuit to which the tapered end 136 is electrically connected. The output end of the RF circuit is where signals to and from a transceiver of the RF circuit are transferred to and from the tapered end 136 of the second connecting element 112.

For instance, the tapered end 136 may have a shape, e.g., including a width, which generates the matching input impedance to the output end of the RF circuit. The matching input impedance may be substantially 50 ohms or any other suitable impedance depending on the design of the RF circuit. Additionally, the tapered end 136 may be located at or near the RF output end of the RF circuit, thereby minimizing a trace between the RF output and a pad to which the tapered end 136 may be soldered, which may reduce RF signal loss to and from the antenna element 102. Moreover, the shape of the first connecting element 120 may be designed to maximize distance between the grounding end 126 electrically connected to the grounding plane of the PCB and the tapered end 136 electrically connected to the RF output of the RF circuit to improve radiation patterns of the antenna element 102.

Figure 2:
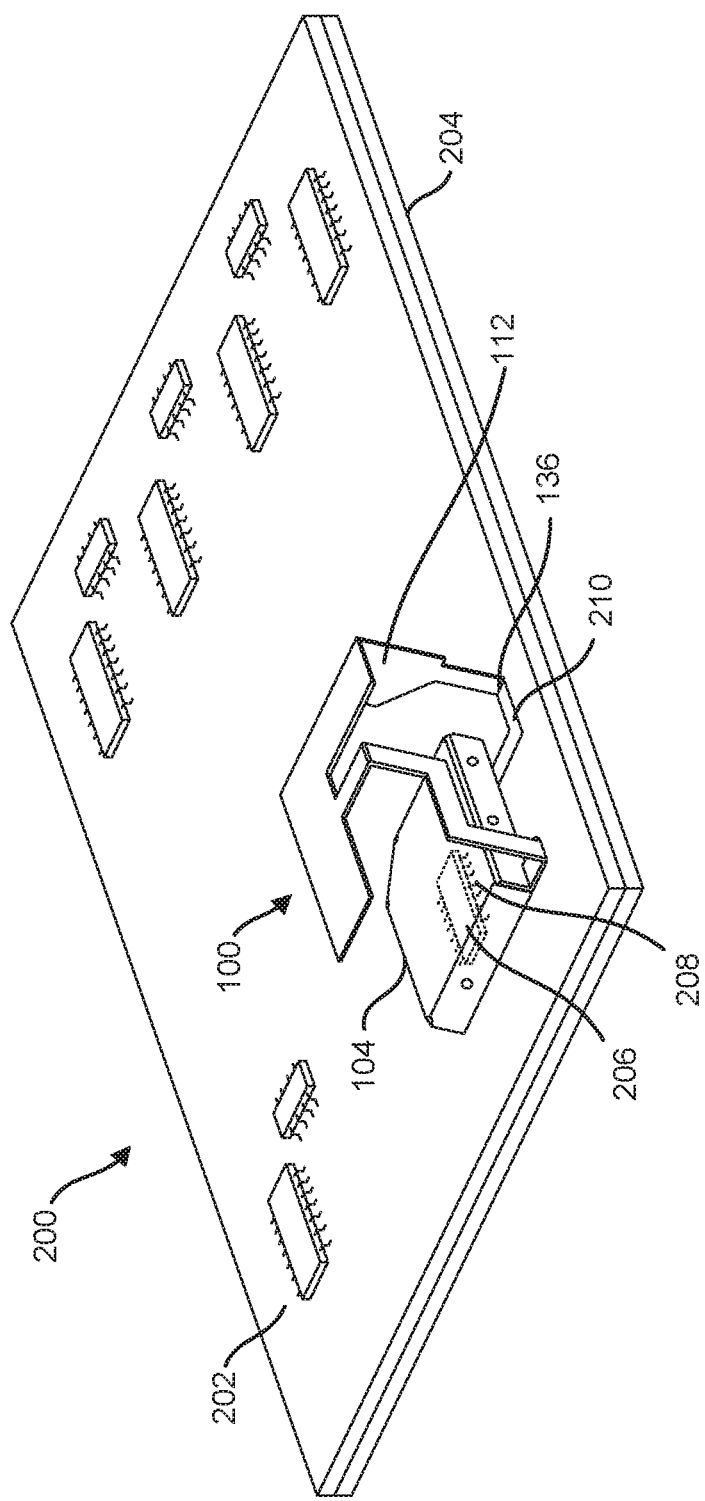
FIG. 2 depicts the integrated antenna device of FIG. 1 mounted to a printed circuit board, according to one or more examples of the present disclosure.

FIG. 2 depicts the integrated antenna device 100 of FIG. 1 mounted to a PCB 202 to form an electronic device 200, according to one or more examples of the present disclosure. In this example, the integrated antenna device 100 is mounted to the PCB 202 using the tapered end 136 and the protrusions 118, which are accordingly not fully shown in FIG. 2. The protrusions 118 may be electrically connected to a grounding plane 204 of the PCB 202, and the tapered end 136 may be electrically connected to a RF output 208 of a RF circuit 206 on the PCB 202 located under the grounding element 104. For example, a trace 210 on the PCB 202 may directly electrically connect the RF output 208 of the RF circuit 206 to the tapered end 136 of the second connecting element 112. More particularly, one end of the trace 210 may directly connect (e.g., via soldering) to the tapered end 136, and another end of the trace 210 (not shown) may directly connect to a pad (not shown) on the PCB 202 to which the RF output 208 is soldered. In another example, the tapered end 136 may be connected to the RF output 208 underneath the top layer of the PCB 202 including at one or more bottom layers of the PCB 202. In yet another example, the protrusions 118 are not electrically connected to the grounding plane 204 but simply serve to position and secure the integrated antenna device 100 to the PCB 202.

In operation, the antenna element 102 receives a RF signal from a transmitter of the RF circuit through the feeder arm 110, which is radiated using the radiator arm 106. The antenna element 102 receives a RF signal through the radiator arm 106, which is provided to a receiver of the RF circuit through the feeder arm 110. In one example, the antenna element may be designed to operate in the 2.4 GHz band of radio frequencies and in the 5 GHz band of radio frequencies in conformance with Bluetooth® Low Energy technology and Viii-Fi® technology (based around Institute of Electrical and Electronics Engineers ("IEEE") 802.11 family of standards). Bluetooth® is a registered trademark of Bluetooth Special Interest Group, and Wi-Fi® is a registered trademark of Wi-Fi Alliance. In one example, the electronic device 200 is included within an access point. In another example, the electronic device 200 is included within a small cell such as a femtocell, a picocell, or a microcell.

Figure 3:
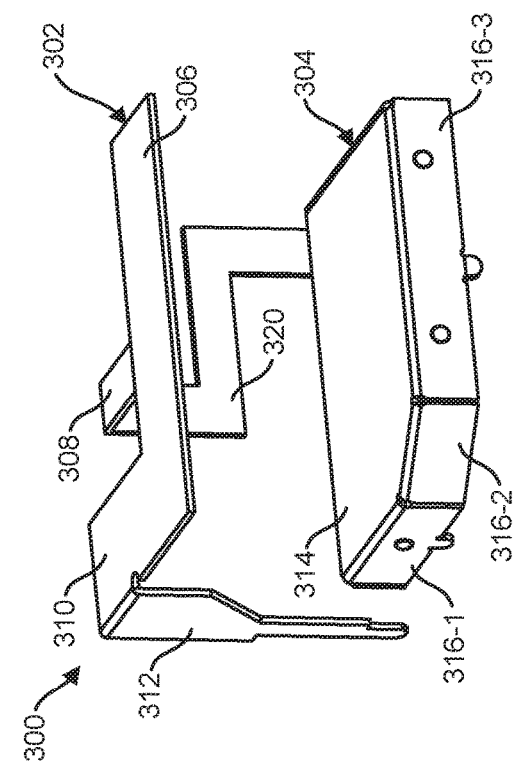
FIG. 3 depicts an integrated antenna device, according to one or more examples of the present disclosure.

FIG. 3 depicts an integrated antenna device 300, according to one or more examples of the present disclosure. The integrated antenna device 300 includes an antenna element 302, a planar grounding element 304, a first connecting element 320, and a second connecting element 312. The antenna element 302 includes a radiator arm 306, a shorting arm 308, and a feeder arm 310. The planar grounding element 304 includes a planar side 314 and a plurality of extension sides (316-1, 316-2, 316-2 shown) perpendicularly connected to the planar side 314. The first connecting element 320 connects the shorting arm 308 to the planar grounding element 304. The second connecting element 312 extends from and perpendicular to the feeder arm 310. In one example, the integrated antenna device 300 is constructed and operates substantially as the integrated antenna device 100 shown in and described by reference to FIGS. 1 and 2.

Figure 4:
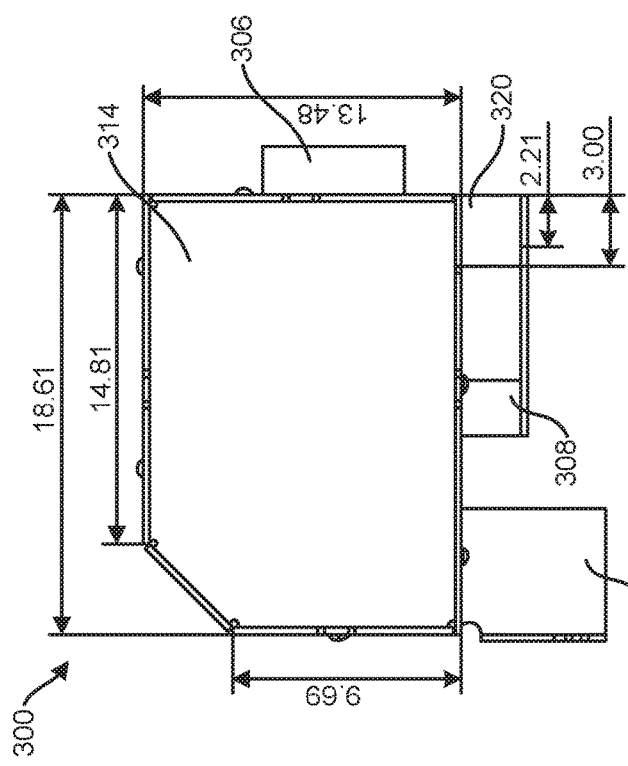
FIG. 4 depicts a bottom view of the integrated antenna device of FIG. 3, according to one or more examples of the present disclosure.
Figure 5:
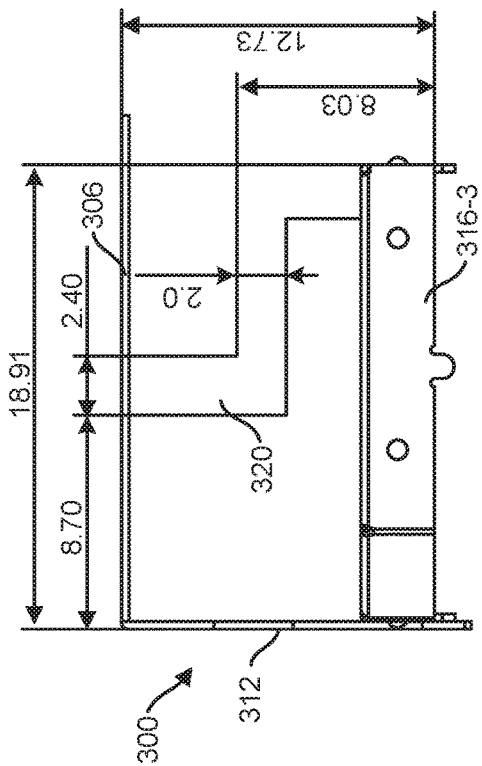
FIG. 5 depicts a front view of the integrated antenna device of FIG. 3, according to one or more examples of the present disclosure.
Figure 6:
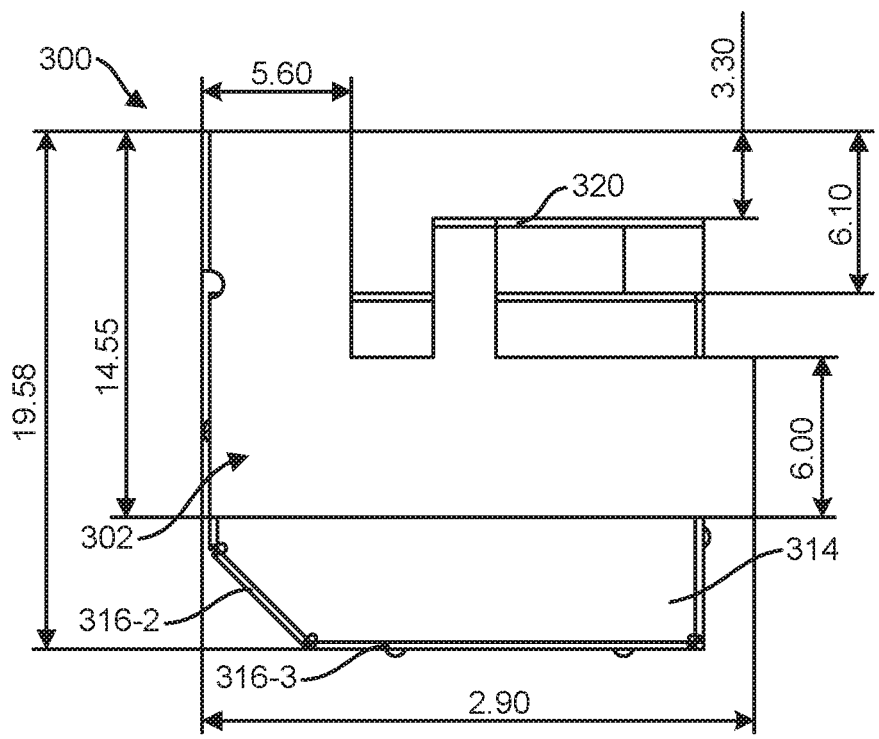
FIG. 6 depicts a top view of the integrated antenna device of FIG. 3; according to one or more examples of the present disclosure.
Figure 7:
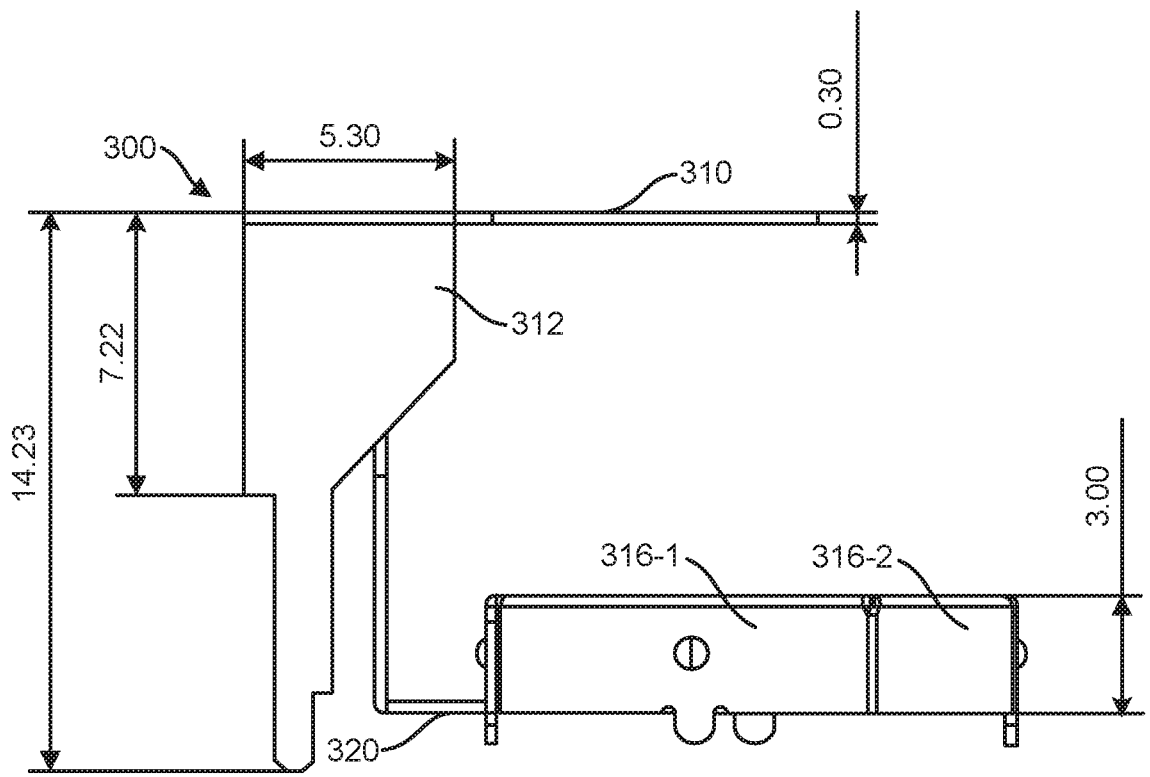
FIG. 7 depicts a side view of the integrated antenna device of FIG. 3, according to one or more examples of the present disclosure.

FIGS. 4-7 depict various views of the integrated antenna device 300, showing example dimensions. The dimensions illustrated therein are in millimeters (mm) and are for this particular example. Other examples may use other dimensions. During manufacturing, the dimensions may be substantially as shown, where in a particular implementation substantially means+/−0.01 mm. Namely, FIG. 4 depicts a bottom view of the integrated antenna device 300. FIG. 5 depicts a front view of the integrated antenna device 300. FIG. 6 depicts a top view of the integrated antenna device 300, and FIG. 7 depicts a side view of the integrated antenna device 300. As illustrated, in an example, the antenna element 302 has an area that is at least half an area of the planar side 314 of the planar grounding element 304.

Figure 8:
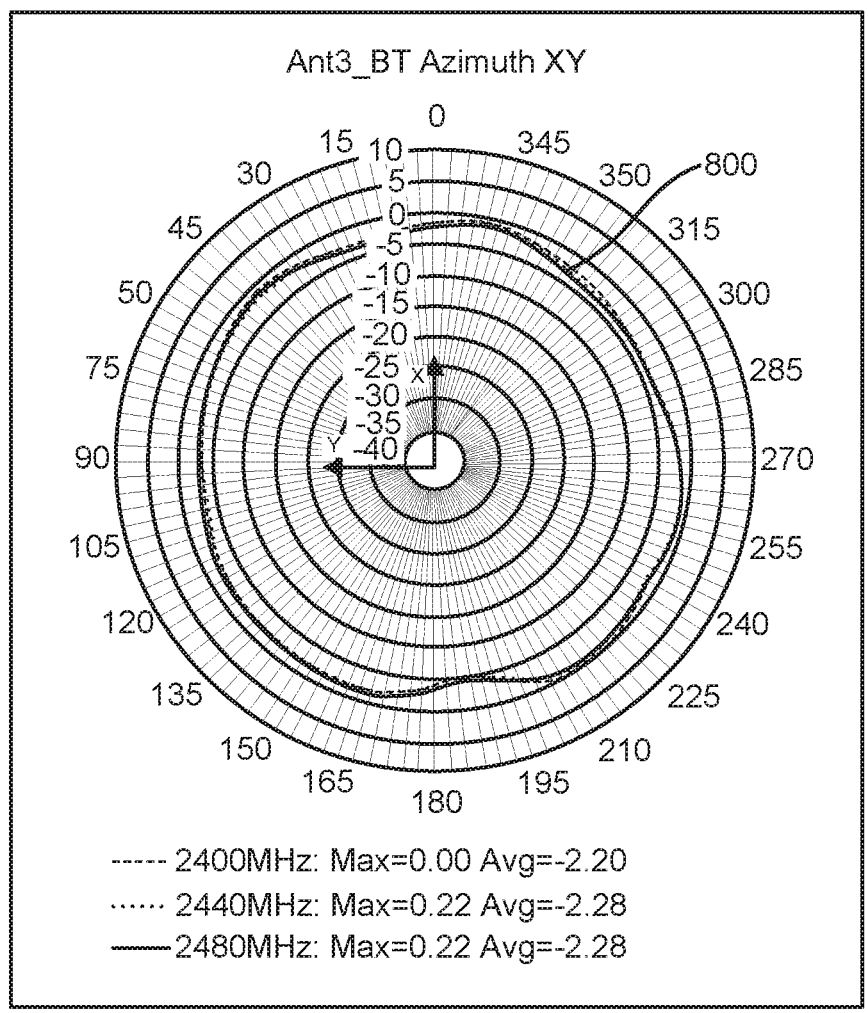
FIG. 8 depicts a set of radiation patterns of an integrated antenna device, according to one or more examples of the present disclosure.
Figure 9:
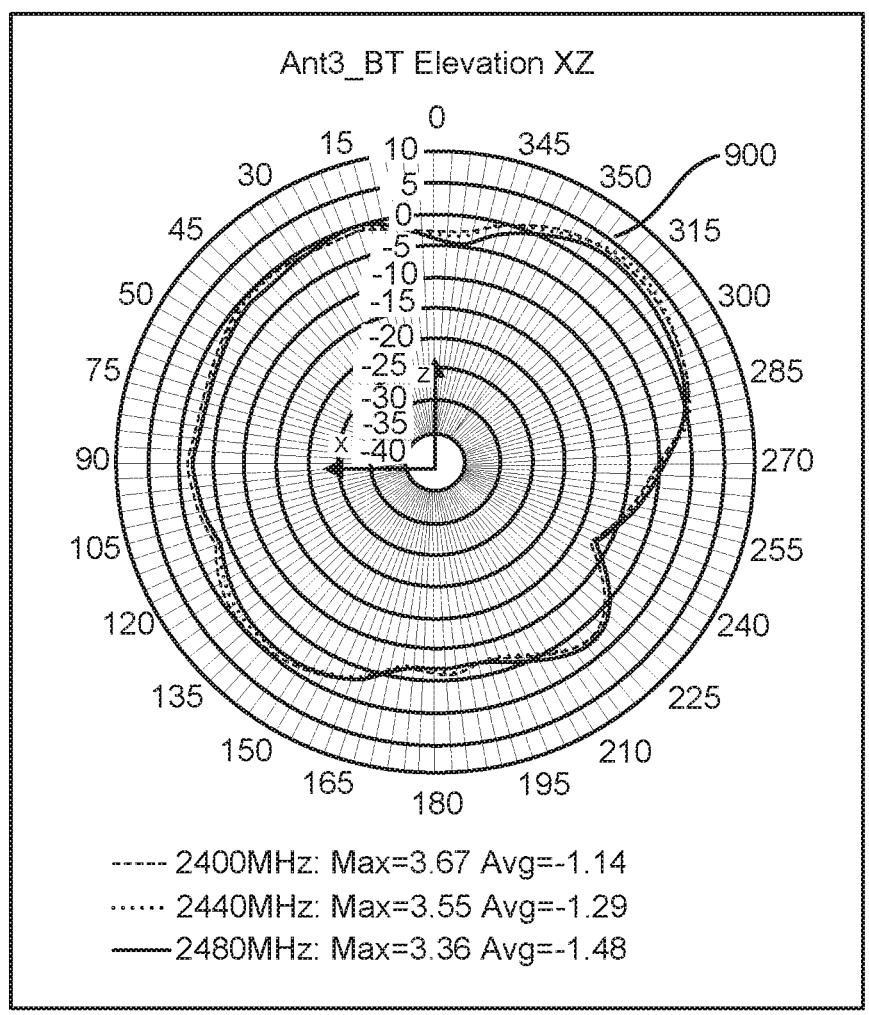
FIG. 9 depicts a set of radiation patterns of an integrated antenna device, according to one or more examples of the present disclosure.
Figure 10:
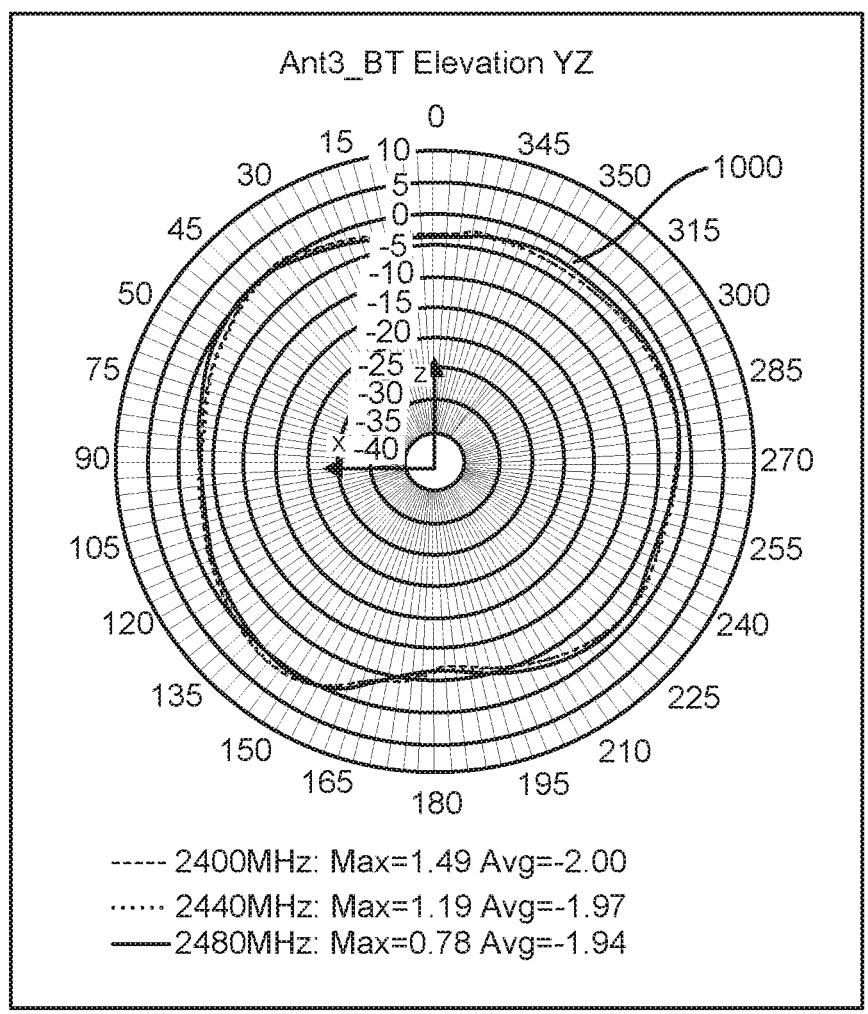
FIG. 10 depicts a set of radiation patterns of an integrated antenna device, according to one or more examples of the present disclosure.

FIGS. 8-10 illustrate radiation patterns 800, 900, and 1000 generated in a lab by an integrated antenna device, in accordance with the present disclosure. For example, the radiation patterns shown in FIGS. 8-10 may be produced by an integrated antenna device having dimensions as illustrated in FIGS. 4-7. In this example, the integrated antenna device is horizontal Omni-radiated and operating in the 2.4 GHz band of radio frequencies in conformance with Bluetooth® Low Energy technology. The patterns, wherein the unit of measurement is dBi, are taken around the Azimuth XY axis in FIG. 8, the Elevation XZ axis in FIG. 9, and the Elevation YZ axis in FIG. 10. Three patterns 800 are shown in FIG. 8 at 2400 MHz, 2440 MHz, and 2480 MHz. Three patterns 900 are shown in FIG. 9 at 2400 MHz, 2440 MHz, and 2480 MHz. Three patterns 1000 are shown in FIG. 10 at 2400 MHz, 2440 MHz, and 2480 MHz. Also illustrated in each of FIGS. 8-10 is maximum and average dBi measurement for each pattern.

The radiation patterns 800, 900, and 1000 are taken around three different axes, namely the XY, XZ, and YZ axes, respectively. As is evident from these radiation patterns, a substantially omni-directional antenna is achieved without having a separate antenna element and EMI shield, even in view of the compact space of the integrated antenna device. Additionally, these substantially omni-directional properties are shown in FIGS. 8-10 to be consistent across multiple frequencies, thereby allowing the integrated antenna device to be useful across multiple applications.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. An electronic device comprising:
a printed circuit board; and
an antenna device mounted to the printed circuit board, the antenna device comprising:
an antenna element comprising a radiator arm, a shorting arm, and a feeder arm, the shorting arm and the feeder arm being coplanar to and extending from an edge of the radiator arm, the feeder arm extending parallel to the shorting arm;
an electromagnetic interference shield element comprising a planar side and a plurality of extension sides perpendicularly connected to the planar side, the plurality of extension sides mounted to the printed circuit board;
a first connecting element comprising a first end connected to the shorting arm of the antenna element and a second end connected to one of the extension sides of the electromagnetic interference shield element, the first connecting element positioning the antenna element and the planar side of the electromagnetic interference shield element in separate parallel planes; and
a second connecting element having a first end connected to the feeder arm of the antenna element and a second end mounted to the printed circuit board.

2. The electronic device of claim 1, wherein the second end of the first connecting element is aligned with a first corner of the electromagnetic interference shield element, and the second end of the second connecting element is aligned with a second corner of the electromagnetic interference shield element.

3. The electronic device of claim 2, the first corner of the electromagnetic interference shield element comprising a first end of the one of the extension sides of the electromagnetic interference shield element connected to the first connecting element, and the second corner of the electromagnetic interference shield element comprising a second end of the one of the extension sides of the electromagnetic interference shield element connected to the first connecting element.

4. The electronic device of claim 1, the antenna device forming an inverted-F antenna, wherein the one of the extension sides of the electromagnetic interference shield element connected to the second end of the first connecting element is electrically connected to a grounding plane of the printed circuit board.

5. The electronic device of claim 1, wherein the second end of second connecting element is directly electrically connected to an output of a radio frequency circuit of the printed circuit board.

6. The electronic device of claim 5, wherein the second end of the second connecting element is tapered relative to the first end of the second connecting element to create a matching input impedance to the output of the radio frequency circuit.

7. The electronic device of claim 1, the antenna element forming an inverted-F antenna.

8. The electronic device of claim 1, the second connecting element comprising a tapered end.

9. The electronic device of claim 8, the tapered end having a shape that generates a matching input impedance to an output of a circuit to which the tapered end electrically connects.

10. An antenna device comprising:
- an antenna element comprising a radiator arm, a shorting arm, and a feeder arm, the shorting arm and the feeder arm being coplanar to and extending from an edge of the radiator arm, the feeder arm extending parallel to the shorting arm;
- an electromagnetic interference shield element comprising a planar side and a plurality of extension sides perpendicularly connected to the planar side, the plurality of extension sides mounted to a printed circuit board;
- a first connecting element comprising a first end connected to the shorting arm of the antenna element and a second end connected to one of the extension sides of the electromagnetic interference shield element, the first connecting element positioning the antenna element and the planar side of the electromagnetic interference shield element in separate parallel planes; and
- a second connecting element having a first end connected to the feeder arm of the antenna element and a second end mounted to the printed circuit board.

11. The antenna device of claim 10, the antenna element forming an inverted-F antenna.

12. The antenna device of claim 10, the second connecting element comprising a tapered end.

13. The antenna device of claim 12, the tapered end having a shape that generates a matching input impedance to an output of a circuit to which the tapered end electrically connects.

14. The electronic device of claim 10, wherein the second end of the first connecting element is aligned with a first corner of the electromagnetic interference shield element, and the second end of the second connecting element is aligned with a second corner of the electromagnetic interference shield element.

15. The electronic device of claim 14, the first corner of the electromagnetic interference shield element comprising a first end of the one of the extension sides of the electromagnetic interference shield element connected to the first connecting element, and the second corner of the electromagnetic interference shield element comprising a second end of the one of the extension sides of the electromagnetic interference shield element connected to the first connecting element.

16. The electronic device of claim 10, the antenna device forming an inverted-F antenna, wherein the one of the extension sides of the electromagnetic interference shield element connected to the second end of the first connecting element is electrically connected to a grounding plane of the printed circuit board.

17. The electronic device of claim 10, wherein the second end of second connecting element is directly electrically connected to an output of a radio frequency circuit of the printed circuit board.

18. The electronic device of claim 17, wherein the second end of the second connecting element is tapered relative to the first end of the second connecting element to create a matching input impedance to the output of the radio frequency circuit.

* * * * *